(12) United States Patent
Matsui et al.

(10) Patent No.: US 10,192,827 B2
(45) Date of Patent: Jan. 29, 2019

(54) TRANSMIT-AND-RECEIVE MODULE

(71) Applicant: Murata Manufacturing Co., Ltd., Kyoto (JP)

(72) Inventors: Hideki Matsui, Kyoto (JP); Yuji Takematsu, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/840,483

(22) Filed: Dec. 13, 2017

(65) Prior Publication Data

US 2018/0166387 A1 Jun. 14, 2018

(30) Foreign Application Priority Data

Dec. 14, 2016 (JP) .................. 2016-242534

(51) Int. Cl.
| | |
|---|---|
| *H01L 23/535* | (2006.01) |
| *H03F 3/195* | (2006.01) |
| *H03F 3/21* | (2006.01) |
| *H01L 23/66* | (2006.01) |
| *H01L 23/00* | (2006.01) |
| *H01L 23/12* | (2006.01) |

(Continued)

(52) U.S. Cl.
CPC .......... *H01L 23/535* (2013.01); *H01L 23/00* (2013.01); *H01L 23/12* (2013.01); *H01L 23/28* (2013.01); *H01L 23/49827* (2013.01); *H01L 23/49838* (2013.01); *H01L 23/66* (2013.01); *H01L 25/04* (2013.01); *H01L 25/18* (2013.01); *H03F 3/195* (2013.01); *H03F 3/21* (2013.01); *H03F 3/213* (2013.01); *H04B 1/38* (2013.01); *H04B 1/40* (2013.01); *H01L 2223/6644* (2013.01); *H03F 2200/294* (2013.01); *H03F 2200/451* (2013.01)

(58) Field of Classification Search
CPC . H01L 21/565; H01L 21/561; H01L 23/3121; H03H 9/1021; B32B 18/00; H05K 9/0032–9/0039; G06F 1/162
USPC ........ 361/763–764, 782–784, 795, 816, 818; 174/255–261; 257/659–690, 787–790
See application file for complete search history.

(56) References Cited

U.S. PATENT DOCUMENTS

| | | | | |
|---|---|---|---|---|
| 8,125,788 B2* | 2/2012 | Hatanaka | ............. | H03H 9/1021 |
| | | | | 257/659 |
| 9,907,179 B2* | 2/2018 | Kawabata | ............. | H01F 1/0306 |

(Continued)

FOREIGN PATENT DOCUMENTS

| | | |
|---|---|---|
| JP | 2005-026373 A | 1/2005 |
| JP | 2005-136272 A | 5/2005 |

*Primary Examiner* — Tuan T Dinh
(74) *Attorney, Agent, or Firm* — Pearne & Gordon LLP

(57) ABSTRACT

A transmit-and-receive module includes a wiring substrate, a low-noise amplifier, a power amplifier, an insulating resin, and a conductive shield. The wiring substrate has a first surface and a second surface which is a back side of the first surface. The low-noise amplifier includes a first signal terminal and a first ground terminal. The first signal terminal is surface-mounted on the first surface. The power amplifier includes a second signal terminal and a second ground terminal. The second signal terminal and the second ground terminal are surface-mounted on the first surface. The insulating resin covers the low-noise amplifier and the power amplifier. The conductive shield covers a surface of the insulating resin. The first ground terminal is connected to the conductive shield.

3 Claims, 4 Drawing Sheets

(51) Int. Cl.
  *H01L 23/28* (2006.01)
  *H01L 25/04* (2014.01)
  *H01L 25/18* (2006.01)
  *H04B 1/38* (2015.01)
  *H04B 1/40* (2015.01)
  *H01L 23/498* (2006.01)
  *H03F 3/213* (2006.01)

(56) References Cited

U.S. PATENT DOCUMENTS

| | | | |
|---|---|---|---|
| 2002/0027018 A1* | 3/2002 | Chikagawa | B32B 18/00 174/255 |
| 2006/0276158 A1* | 12/2006 | Okabe | H04B 1/38 455/333 |
| 2008/0315396 A1* | 12/2008 | Kuhlman | H01L 23/3121 257/692 |
| 2010/0172116 A1* | 7/2010 | Yorita | H01L 21/565 361/816 |
| 2011/0248389 A1* | 10/2011 | Yorita | H01L 23/3677 257/659 |
| 2012/0187551 A1* | 7/2012 | Kushino | H01L 21/561 257/659 |
| 2012/0228751 A1* | 9/2012 | Song | H01L 23/552 257/660 |

* cited by examiner

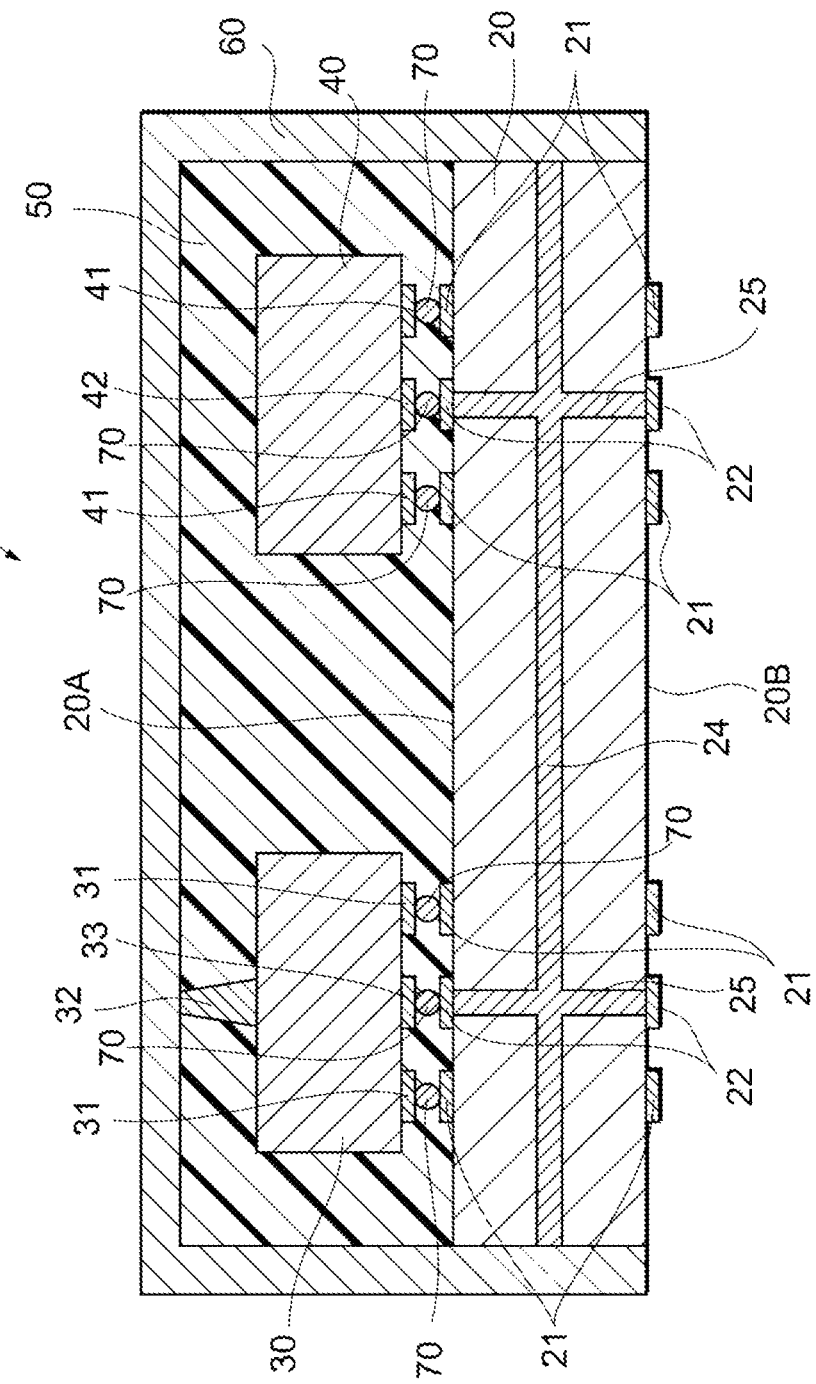

TRANSMIT-AND-RECEIVE MODULE

This application claims priority from Japanese Patent Application No. 2016-242534 filed on Dec. 14, 2016. The content of this application is incorporated herein by reference in its entirety.

BACKGROUND OF THE DISCLOSURE

1. Field of the Disclosure

The present disclosure relates to a transmit-and-receive module.

2. Description of the Related Art

The following radio-frequency module is known. A radio-frequency semiconductor element used in radio-frequency bands such as microwave and millimeter-wave bands and a semiconductor element, such as a large-scale integrated circuit, are mounted on the same wiring substrate. Japanese Unexamined Patent Application Publication No. 2005-136272 discloses the following structure as this type of radio-frequency module. A wiring substrate having semiconductor elements mounted thereon is covered with a conductive cover, and the semiconductor elements and the conductive cover are connected to each other. In this structure, instead of separating grounds for the individual semiconductor elements, a solid ground (a common ground) is used, thereby reinforcing the effect of grounding.

BRIEF SUMMARY OF THE DISCLOSURE

In accordance with high integration of mounting components, more and more mobile communication terminals have the following type of radio-frequency module mounted thereon. A power amplifier for amplifying a transmit signal and a low-noise amplifier for amplifying a received signal without significantly increasing noise are surface-mounted on the same wiring substrate. In this type of radio-frequency module, if a solid ground is used for the power amplifier and the low-noise amplifier, noise may leak into these components via this solid ground (this common ground), which may cause the degradation of the characteristics of the power amplifier and the low-noise amplifier. The influence of noise on the power amplifier and the low-noise amplifier are increased particularly when they are located close to each other on the same wiring substrate.

The present disclosure has been made to address this issue. It is an object of the present disclosure to provide a transmit-and-receive module that is capable of reducing the influence of noise.

According to a preferred embodiment of the present disclosure, there is provided a transmit-and-receive module including a wiring substrate, a low-noise amplifier, a power amplifier, an insulating resin, and a conductive shield. The wiring substrate has a first surface and a second surface which is a back side of the first surface. The low-noise amplifier includes a first signal terminal and a first ground terminal. The first signal terminal is surface-mounted on the first surface. The power amplifier includes a second signal terminal and a second ground terminal. The second signal terminal and the second ground terminal are surface-mounted on the first surface. The insulating resin covers the low-noise amplifier and the power amplifier. The conductive shield covers a surface of the insulating resin. The first ground terminal is connected to the conductive shield.

By using a transmit-and-receive module according to a preferred embodiment of the disclosure, it is possible to reduce the influence of noise.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 4 is a sectional view illustrating the schematic configuration of a transmit-and-receive module according to a third embodiment of the disclosure.

DETAILED DESCRIPTION OF THE DISCLOSURE

Figure 1:
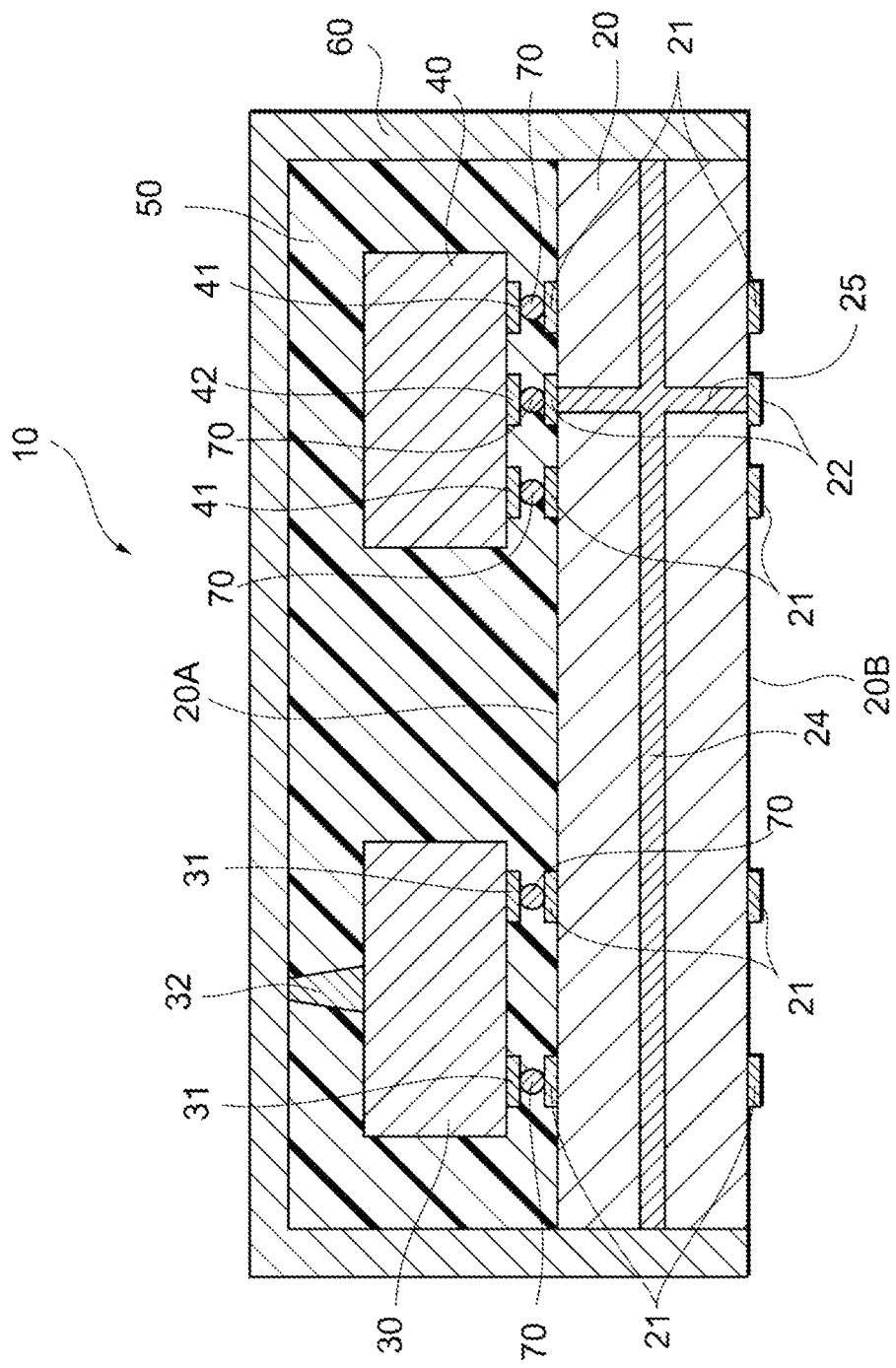
FIG. 1 is a sectional view illustrating the schematic configuration of a transmit-and-receive module according to a first embodiment of the disclosure.

Embodiments of the disclosure will be described below with reference to the accompanying drawings. The same elements or the same members are designated by like reference numeral, and the same explanation thereof will not be repeated.

FIG. 1 is a sectional view illustrating the schematic configuration of a transmit-and-receive module 10 according to a first embodiment of the disclosure. The transmit-and-receive module 10 is used in a mobile communication terminal, such as a cellular phone, and performs signal processing for transmitting and receiving radio frequency (RF) signals of multiple bands to and from a base station. The transmit-and-receive module 10 is also called a radio-frequency module. The transmit-and-receive module 10 includes a wiring substrate 20, a low-noise amplifier 30, a power amplifier 40, an insulating resin 50, and a conductive shield 60.

The wiring substrate 20 is also called a mounting substrate. Signal terminals 21 and a ground terminal 22 are formed on each of two main surfaces of the wiring substrate 20. One of the two main surfaces is called a first surface 20A, while the other main surface is called a second surface 20B. The second surface 20B is the back side of the first surface 20A. A ground layer 24 and a via-hole 25 are formed within the wiring substrate 20, and the ground terminal 22 formed on the first surface 20A and the ground terminal 22 formed on the second surface 20B are connected to each other via the ground layer 24 and the via-hole 25.

The low-noise amplifier 30 is a discrete component, such as a single integrated circuit (IC) chip, designed to amplify an RF signal received from an antenna without significantly increasing noise and to supply the amplified RF signal to a radio frequency integrated circuit (RFIC) as a received signal. The low-noise amplifier 30 includes signal terminals 31 for allowing RF signals to flow therethrough and a ground terminal 32. Each of the signal terminals 31 is surface-mounted on a corresponding signal terminal 21 formed on the first surface 20A with a bump 70 therebetween.

The power amplifier 40 is a discrete component, such as a single IC chip, designed to amplify an RF signal output from the RFIC and to supply the amplified RF signal to the antenna as a transmit signal. The power amplifier 40 includes signal terminals 41 for allowing RF signals to flow therethrough and a ground terminal 42. Each of the signal terminals 41 is surface-mounted on a corresponding signal terminal 21 formed on the first surface 20A with a bump 70 therebetween. Similarly, the ground terminal 42 is surface-mounted on the ground terminal 22 formed on the first surface 20A with a bump 70 therebetween.

Surface-mounting between the low-noise amplifier 30 and the first surface 20A of the wiring substrate 20 is preferably performed by flip-chip mounting, for example. Likewise, surface-mounting between the power amplifier 40 and the first surface 20A of the wiring substrate 20 is preferably performed by flip-chip mounting, for example.

The insulating resin 50 is formed to cover the low-noise amplifier 30 and the power amplifier 40. Covering of the low-noise amplifier 30 and the power amplifier 40 by using the insulating resin 50 is also called a resin sealing. The insulating resin 50 thus serves as a sealing member. The material for the insulating resin 50 is an epoxy resin, for example. The conductive shield 60 is formed to cover the surface of the insulating resin 50. The material for the conductive shield 60 is a metal, such as gold, silver, copper, aluminum, iron, nickel, and stainless steel.

The ground terminal 32 of the low-noise amplifier 30 is connected to the conductive shield 60. The ground terminal 32 is a protruding metal terminal, for example. Such a metal terminal may be a wire which is cut to a predetermined length, such as that used in wire bonding.

The conductive shield 60 is connected to the ground layer 24 on the side surfaces of the wiring substrate 20. The ground terminal 32 of the low-noise amplifier 30 is connected to the ground layer 24 via the conductive shield 60. The ground terminal 42 of the power amplifier 40 is connected to the ground layer 24 by being surface-mounted on the ground terminal 22 formed on the first surface 20A of the wiring substrate 20. The ground terminal 22 formed on the second surface 20B of the wiring substrate 20 is connected to a ground terminal of a motherboard substrate.

In the first embodiment, it is possible to make the distance between the ground terminal 32 of the low-noise amplifier 30 and the ground terminal 42 of the power amplifier 40 longer than that when the ground terminal 32 of the low-noise amplifier 30 is surface-mounted on the first surface 20A of the wiring substrate 20. It is thus less likely that the degradation of the characteristics of the low-noise amplifier 30 and the power amplifier 40 caused by a leakage of noise thereinto via a ground will occur. The ground terminal 32 of the low-noise amplifier 30 is not surface-mounted on the first surface 20A of the wiring substrate 20. This enhances the flexibility in designing terminals to be formed on the first surface 20A. In particular, the density of bumps on the wiring substrate 20 is decreased, thereby achieving sufficient isolation between terminals on the first surface 20A and also contributing to reducing the size of the transmit-and-receive module 10. The power amplifier 40 produces a greater amount of heat than the low-noise amplifier 30. To achieve suitable heat dissipation from the power amplifier 40, the ground terminal 42 is preferably connected to a ground terminal of a motherboard substrate via the wiring substrate 20 rather than being connected to the conductive shield 60.

The present disclosure is not restricted to the above-described example. For example, the ground terminal 32 of the low-noise amplifier 30 may be surface-mounted on the wiring substrate 20, while the ground terminal 42 of the power amplifier 40 may be connected to the conductive shield 60. The transmit-and-receive module 10 may include another element, such as an antenna switch, a duplexer, or a matching circuit, in addition to the low-noise amplifier 30 and the power amplifier 40.

If it is necessary to distinguish between the ground terminal 32 of the low-noise amplifier 30 and the ground terminal 42 of the power amplifier 40, the ground terminal 32 is called a first ground terminal, while the ground terminal 42 is called a second ground terminal. Similarly, if it is necessary to distinguish between the signal terminals 31 of the low-noise amplifier 30 and the signal terminals 41 of the power amplifier 40, the signal terminals 31 are called first signal terminals, while the signal terminals 41 are called second signal terminals.

Figure 2:
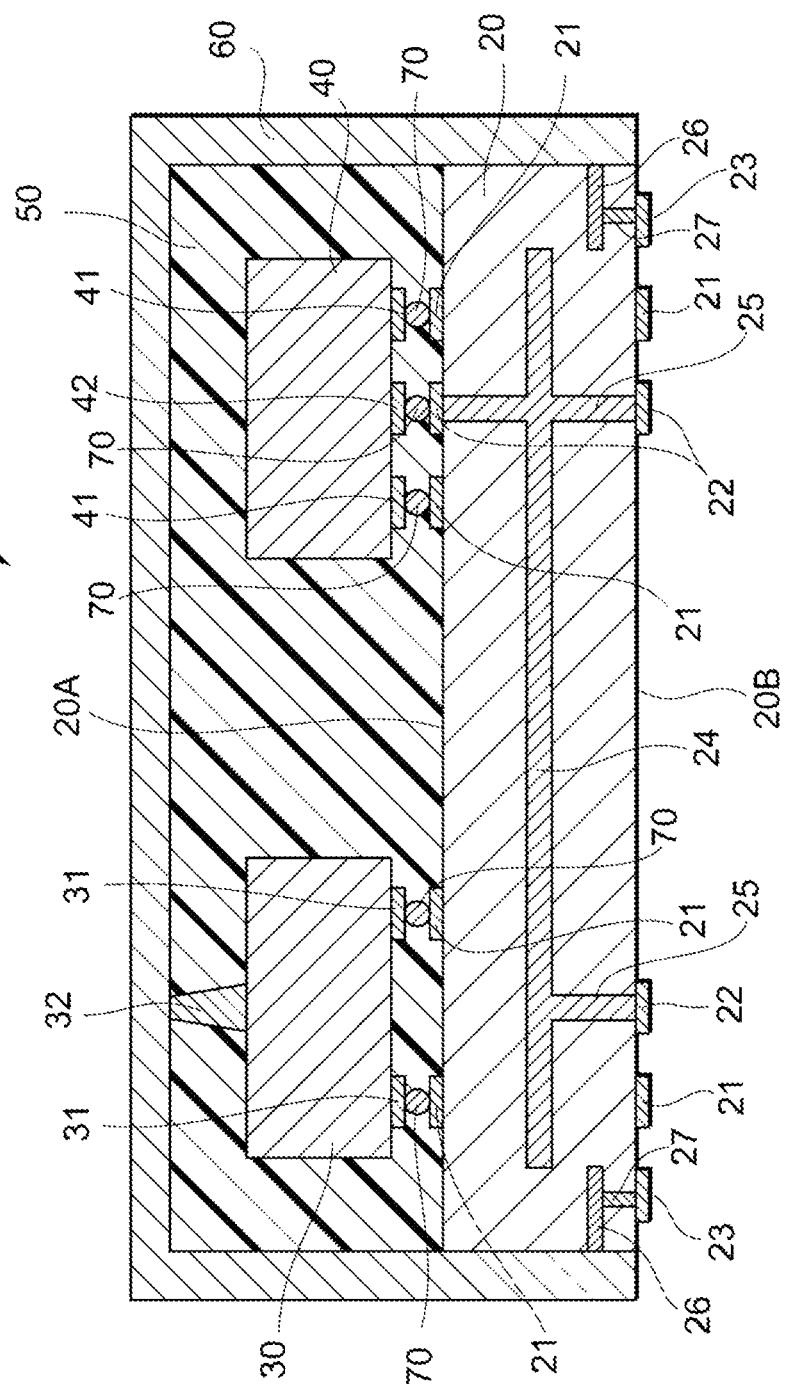
FIG. 2 is a sectional view illustrating the schematic configuration of a transmit-and-receive module according to a second embodiment of the disclosure.

FIG. 2 is a sectional view illustrating the schematic configuration of a transmit-and-receive module 80 according to a second embodiment of the disclosure. The transmit-and-receive module 80 differs from the transmit-and-receive module 10 of the first embodiment in that the conductive shield 60 is not connected to the ground layer 24, but is connected to ground terminals 23 formed on the second surface 20B of the wiring substrate 20.

Figure 3:
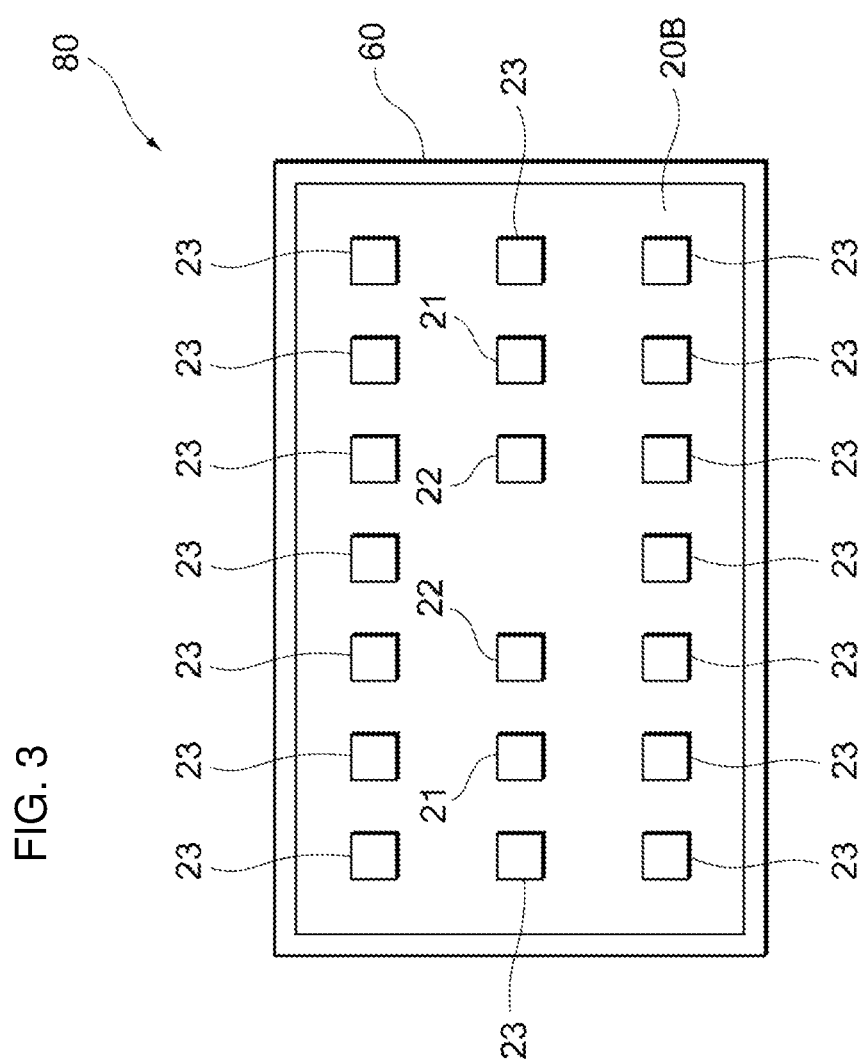
FIG. 3 is a plan view illustrating the transmit-and-receive module according to the second embodiment of the disclosure.

As shown in FIG. 3, signal terminals 21 and ground terminals 22 and 23 are formed on the second surface 20B of the wiring substrate 20. Although the ground terminals 22 and the ground terminals 23 are separated from each other, they are both connected to a ground terminal of a motherboard substrate. As shown in FIG. 2, the ground terminals 22 formed on the second surface 20B are connected to the ground terminal 42 of the power amplifier 40 via the ground layer 24 and the via-hole 25. The ground terminals 23 formed on the second surface 20B are connected to the ground terminal 32 of the low-noise amplifier 30 via a via-hole 27, a ground layer 26, and the conductive shield 60. The ground layers 24 and 26 are separated from each other within the wiring substrate 20. In this manner, the ground terminal 32 of the low-noise amplifier 30 is connected to the ground terminals 23 formed on the second surface 20B via the conductive shield 60. The ground terminal 42 of the power amplifier 40 is connected to the ground terminals 22 formed on the second surface 20B by being surface-mounted on the first surface 20A of the wiring substrate 20.

In the second embodiment, the ground of the low-noise amplifier 30 and the ground of the power amplifier 40 are totally separated from each other within the transmit-and-receive module 80. It is thus even less likely that the degradation of the characteristics of the low-noise amplifier 30 and the power amplifier 40 caused by a leakage of noise thereinto via a ground will occur.

If it is necessary to distinguish between the ground terminals 22 and 23, the ground terminals 23 are called third ground terminals, while the ground terminals 22 are called fourth ground terminals.

FIG. 4 is a sectional view illustrating the schematic configuration of a transmit-and-receive module 90 according to a third embodiment of the disclosure. The transmit-and-receive module 90 differs from the transmit-and-receive module 10 of the first embodiment in that the low-noise amplifier 30 includes a ground terminal 33 surface-mounted on the wiring substrate 20, in addition to the ground terminal 32 connected to the conductive shield 60. The ground terminal 33 is surface-mounted on the ground terminal 22 formed on the first surface 20A of the wiring substrate 20 with a bump 70 therebetween.

In the first embodiment, it is not possible to form the ground terminal 32 before the low-noise amplifier 30 and the power amplifier 40 are sealed with the insulating resin 50, thereby failing to evaluate the electrical characteristics of the low-noise amplifier 30 before the ground terminal 32 is formed. In contrast, in the third embodiment, the ground terminal 33 is surface-mounted on the wiring substrate 20, thereby making it possible to evaluate the electrical characteristics of the low-noise amplifier 30 before the ground terminal 32 is formed.

The above-described embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A transmit-and-receive module comprising:
   a wiring substrate having first and second surfaces, the second surface being a back side of the first surface;
   a low-noise amplifier including a first signal terminal and a first ground terminal, the first signal terminal being surface-mounted on the first surface;
   a power amplifier including a second signal terminal and a second ground terminal, the second signal terminal and the second ground terminal being surface-mounted on the first surface;
   an insulating resin covering the low-noise amplifier and the power amplifier; and
   a conductive shield covering a surface of the insulating resin, wherein the first ground terminal is connected to the conductive shield, and wherein:
   the wiring substrate includes a ground layer;
   the first ground terminal is connected to the ground layer via the conductive shield;
   the second ground terminal is connected to the ground layer by being surface-mounted on the first surface; and
   the first ground terminal is a protruding metal terminal.

2. The transmit-and-receive module according to claim 1, wherein:
   the second surface includes third and fourth ground terminals separated from each other;
   the first ground terminal is connected to the third ground terminal via the conductive shield; and
   the second ground terminal is connected to the fourth ground terminal by being surface-mounted on the first surface.

3. The transmit-and-receive module according to claim 1, wherein:
   the conductive shield is connected to the ground layer on the side surfaces of the wiring substrate.

* * * * *